United States Patent
Li et al.

(10) Patent No.: US 9,841,690 B2
(45) Date of Patent: Dec. 12, 2017

(54) METHOD AND APPARATUS FOR EXPOSURE PATTERN CORRECTION AND EXPOSURE SYSTEM

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yifeng Li, Bejing (CN); Hequn Zhang, Beijing (CN); Xiangming Meng, Beijing (CN); Hongwei Xing, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/135,373

(22) Filed: Apr. 21, 2016

(65) Prior Publication Data

US 2017/0023864 A1 Jan. 26, 2017

(30) Foreign Application Priority Data

Jul. 23, 2015 (CN) .......................... 2015 1 0444202

(51) Int. Cl.
 G03F 7/20 (2006.01)
 G02F 1/13 (2006.01)
 G03F 9/00 (2006.01)
(52) U.S. Cl.
 CPC ........ G03F 7/70775 (2013.01); G02F 1/1303 (2013.01); G03F 7/7055 (2013.01); G03F 9/703 (2013.01)

(58) Field of Classification Search
 None
 See application file for complete search history.

(56) References Cited

U.S. PATENT DOCUMENTS

| 4,636,626 A * | 1/1987 | Hazama | G03F 9/7023 |
| | | | 250/201.4 |
| 6,258,495 B1 | 7/2001 | Okamura et al. | |
| 2002/0016646 A1 * | 2/2002 | Kim | G03F 7/70633 |
| | | | 700/121 |

FOREIGN PATENT DOCUMENTS

| CN | 1120683 A | 4/1996 |
| CN | 101213492 A | 7/2008 |

(Continued)

OTHER PUBLICATIONS

China Office Action, Application No. 201510444202.X, dated Aug. 31, 2016, 5 pps.

(Continued)

*Primary Examiner* — Steven H Whitesell Gordon
(74) *Attorney, Agent, or Firm* — Armstrong Teasdale LLP (57) ABSTRACT

A method for correcting an exposure pattern on a substrate includes obtaining, based on the exposure pattern, displacement adjustment parameters for adjusting displacements of a worktable supporting the substrate in each of a first direction and a second direction, a rotation angle adjustment parameter for adjusting a rotation angle of the worktable in a rotation direction, and a gap adjustment parameter for adjusting a gap between the worktable and a mask plate. The first direction and the second direction are perpendicular to each other in a horizontal plane. The rotation direction is a direction in which the worktable rotates around a central axis of a base table supporting the mask plate. The method further includes moving the worktable based on the dis- (Continued)

placement adjustment parameters, the rotation angle adjustment parameter and the gap adjustment parameter.

10 Claims, 4 Drawing Sheets

(56) References Cited

FOREIGN PATENT DOCUMENTS

| | | | |
|---|---|---|---|
| CN | 103064255 | A | 4/2013 |
| CN | 104122770 | A | 10/2014 |
| EP | 1465017 | A2 | 10/2004 |
| JP | 3198320 | A | 8/1991 |

OTHER PUBLICATIONS

China Office Action, Application No. 201510444202.X, dated Jan. 25, 2017, 5 pps.
English Translation of China Office Action, Application No. 20150444202.X, dated Jan. 25. 2017, 9 pps.
CN First Office Action, dated Aug. 31, 2016, (English Translation), Entitled Black Matrix Exposed Pattern Revisal Method, Apparatus, and Exposure System, Application No. 201510444202.X, filed Jul. 23, 2015 (5 pages).
English Translation of CN Search Report, Application No. 201510444202.X, filed Jul. 23, 2015, entitled "Black Matrix Exposed Pattern Revisal Method, Apparatus, and Exposure System", 2pp.; (CN version and cited references previously provided to the Patent Office).

* cited by examiner

METHOD AND APPARATUS FOR EXPOSURE PATTERN CORRECTION AND EXPOSURE SYSTEM

CROSS-REFERENCE TO RELATED APPLICATIONS

This application claims priority to Chinese Patent Application No. 201510444202.X, filed on Jul. 23, 2015, the disclosure of which is incorporated herein by reference in its entirety.

BACKGROUND

The disclosure relates to liquid crystal display technologies, and more particularly, to a method and apparatus for correcting an exposure pattern on a substrate, and an exposure system.

As development of display technologies continues, demands for display quality of a display device are increasing. In the process of manufacturing a Thin Film Transistor Liquid Crystal Display (TFT-LCD), an exposure process is usually used. As an example, in the process of forming a Color Filter (CF), a Black Matrix (BM) is firstly formed on a substrate, and then a color resin layer is formed. Then the substrate arranged with the color resin layer is exposed by using a mask plate to form an exposure pattern on the substrate.

However, during the exposure, there is no alignment identifier for the mask plate and the substrate, and fluctuation may happen to an exposure device, and thus the actual exposure pattern may be different from a desired exposure pattern (i.e. deformation). It is required to correct positions of the exposure pattern, so as to ensure that positions of liquid crystal cells corresponding to the exposure pattern are aligned with an array substrate. Otherwise if the position of the liquid crystal cell deviates when the color filter is being aligned with the array substrate, it will result in light leakage in the liquid crystal panel.

BRIEF DESCRIPTION

Embodiments of the disclosure provide a method and apparatus for correcting an exposure pattern, and an exposure system, which can improve correction accuracy and accordingly improve display quality of a display panel.

According to one aspect of the disclosure, there is provided a method for correcting an exposure pattern on a substrate. In the method a displacement adjustment parameter for adjusting displacements of a worktable supporting the substrate in each of a first direction and a second direction, a rotation angle adjustment parameter for adjusting a rotation angle of the worktable in a rotation direction, and a gap adjustment parameter for adjusting a gap between the worktable and a mask plate are obtained based on the exposure pattern. The first direction and the second direction are perpendicular to each other in a horizontal plane, and the rotation direction is a direction in which the worktable rotates around a central axis of a base table supporting the mask plate. The worktable is moved based on the displacement adjustment parameter, the rotation angle adjustment parameter and the gap adjustment parameter.

In one embodiment, in the obtaining of the displacement adjustment parameters, the rotation angle adjustment parameter and the gap adjustment parameter based on the exposure pattern, firstly information related to the exposure pattern is acquired, and based on the acquired information, a region to be corrected in the exposure pattern is determined. Then the displacement adjustment parameters, the rotation angle adjustment parameter and the gap adjustment parameter are determined based on the region to be corrected.

In one embodiment, in the determination of the displacement adjustment parameters, the rotation angle adjustment parameter, and the gap adjustment parameter based on the region to be corrected, a difference value between a measured value of a position of a liquid crystal cell corresponding to the region to be corrected and a predefined value is computed. Then based on the difference value, the displacement adjustment parameters, the rotation angle adjustment parameter and the gap adjustment parameter are determined.

In one embodiment, the moving of the worktable based on the gap adjustment parameter includes adjusting, based on the gap adjustment parameter, heights of supporting seats of the worktable.

According to another aspect of the disclosure, there is provided an apparatus for correcting an exposure pattern on a substrate. The apparatus includes an obtaining module configured to obtain, based on the exposure patterns, displacement adjustment parameters for adjusting displacements of a worktable supporting the substrate in each of a first direction and a second direction, a rotation angle adjustment parameter for adjusting a rotation angle of the worktable in a rotation direction, and a gap adjustment parameter for adjusting a gap between the worktable and a mask plate. The first direction and the second direction are perpendicular to each other in a horizontal plane, and the rotation direction is a direction in which the worktable rotates around a central axis of a base table supporting the mask plate. The apparatus further includes a processing module configured to move the worktable based on the displacement adjustment parameters, the rotation angle adjustment parameter and the gap adjustment parameter.

In one embodiment, the obtaining module includes an acquiring unit configured to acquire information related to the exposure pattern, a region determination unit configured to determine a region to be corrected in the exposure pattern based on the acquired information, and a parameter determination unit configured to determine the displacement adjustment parameters, the rotation angle adjustment parameter and the gap adjustment parameter based on the determined region to be corrected.

In one embodiment, the parameter determination unit includes a computation subunit configured to compute a difference value between a measured value of a position of a liquid crystal cell corresponding to the region to be corrected and a predefined value, and a determination subunit configured to determine the displacement adjustment parameters, the rotation angle adjustment parameter and the gap adjustment parameter based on the difference value.

In one embodiment, the processing module is further configured to adjust a height of at least one supporting seat of the worktable based on the gap adjustment parameter.

According to still another aspect of the disclosure, there is provided an exposure system. The exposure system includes a worktable that includes a first surface configured to support a substrate. The worktable is provided with a plurality of supporting seats coupled to a second surface of the worktable which is opposite to the first surface. The exposure system also includes a base table above the worktable. The base table is configured to support a mask plate. Further the exposure system includes a control device configured to obtain displacement adjustment parameters for adjusting displacements of the worktable in each of a first direction and a second direction, a rotation angle adjustment parameter for adjusting a rotation angle of the worktable in a rotation direction, and a gap adjustment parameter for adjusting a gap between the worktable and the mask plate based on the exposure pattern. The first direction and the second direction are perpendicular to each other in a horizontal plane, and the rotation direction is a direction in which the worktable rotates around a central axis of the base table. The control device is further configured to move the worktable based on the displacement adjustment parameters, the rotation angle adjustment parameter and the gap adjustment parameter.

In one embodiment, the control device includes an acquiring module configured to acquire information related to the exposure pattern, a region determination module configured to determine a region to be corrected in the exposure pattern based on the acquired information, and a parameter determination module configured to determine the displacement adjustment parameters, the rotation angle adjustment parameter and the gap adjustment parameter based on the region to be corrected.

BRIEF DESCRIPTION OF THE DRAWINGS

The drawings described herein are for illustrative purposes only, do not include all possible implementations of the disclosure, and are not intended to limit the scope of the present disclosure, wherein.

DETAILED DESCRIPTION

To facilitate better understanding of the embodiments of the present disclosure, the embodiments of the present disclosure will be described in detail in conjunction with the drawings. While several embodiments have been described, these embodiments have been presented by way of examples only, and are not intended to limit the scope of the disclosure. Indeed, the embodiments described herein may be embodied in a variety of other forms. Furthermore, various modifications and variations may be made without departing from the spirit of the present disclosure.

Usually, the exposure pattern may be corrected by moving the worktable supporting the substrate to adjust three parameters X, Y, θ of the substrate. Parameters X and Y indicate displacements of the substrate in direction X and direction Y. Directions X and Y are perpendicular to each other in a horizontal plane. Parameter θ represents a rotation angle in a rotation direction about a center of exposure, wherein the rotation direction is a direction in which the worktable rotates with respect to a central axis of the base table supporting the mask plate. In this method, parameters X, Y and θ may be computed based on a difference value between a measure value and a predefined value of a position of the liquid crystal cell corresponding to a region of the exposure pattern to be corrected, and then the relative position between the mask plate and the substrate may be adjusted to correct the region of the exposure pattern to be corrected.

Figure 1:
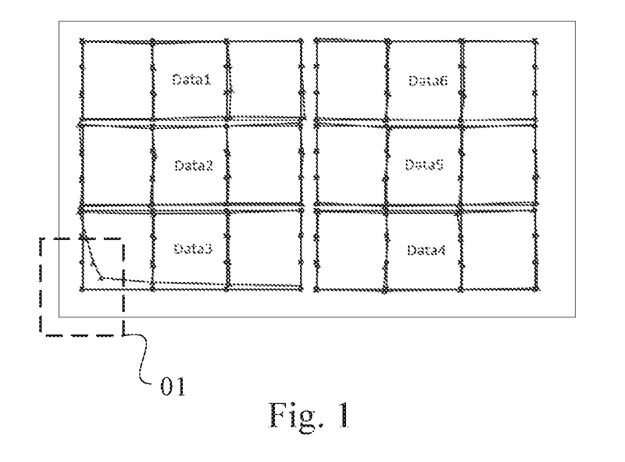
FIG. 1 illustrates an example of a deformed exposure pattern.
Figure 2:
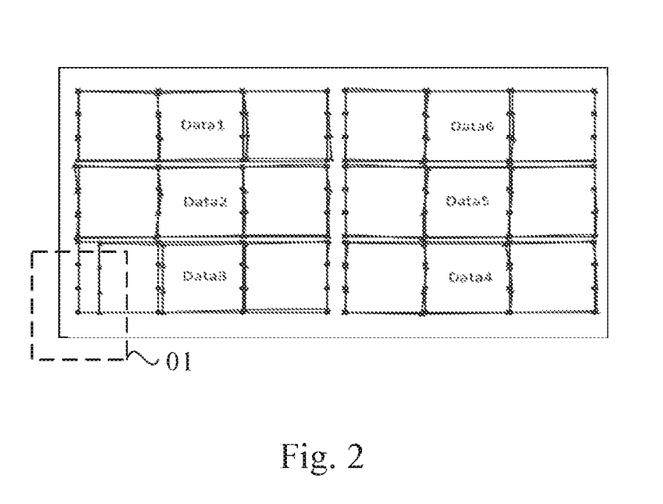
FIG. 2 illustrates another example of the deformed exposure pattern.

However, the correction method described above has several disadvantages. FIG. 1 and FIG. 2 illustrate two examples of the deformed exposure patterns in which region 01 is determined as the region to be corrected. But the above method cannot effectively correct such the deformed exposure patterns as shown in FIGS. 1 and 2, and thus the quality of the display panel may be deteriorated.

Figure 3:
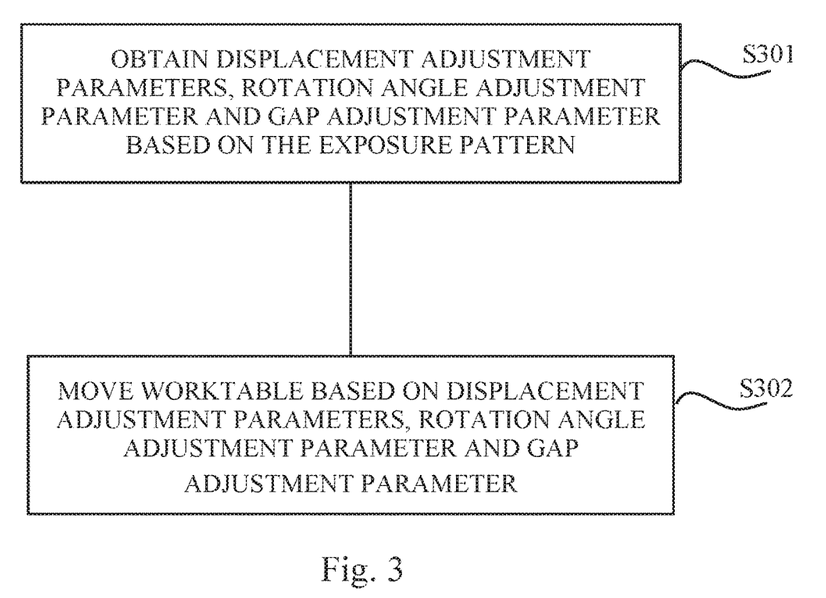
FIG. 3 is a schematic flowchart illustrating the method for correcting an exposure pattern on a substrate according to an embodiment.

FIG. 3 shows the flowchart of the method for correcting an exposure pattern on a substrate according to at least one embodiment.

As shown in FIG. 3, at step S301, the displacement adjustment parameters for adjusting displacements of the worktable in a first direction and a second direction, the rotation angle adjustment parameter for adjusting the rotation angle of the worktable in the rotation direction, and the gap adjustment parameter for adjusting the gap between the worktable and a mask plate are obtained based on the exposure pattern. In this step, the first direction and the second direction are perpendicular to each other in a horizontal plane, and the rotation direction is a direction in which the worktable rotates around a central axis of the base table supporting the mask plate.

In an embodiment, if the worktable and the base table are both in the form of cuboid, the rotation angle may be defined as an angle between a side of the worktable and a projection of a side of the base table on the surface of the worktable that supports the substrate. In addition, the central axis of the base table may be defined as an axis which is perpendicular to a geometric center of the base table.

Then at step 302, the worktable is moved based on the displacement adjustment parameters, the rotation angle adjustment parameter and the gap adjustment parameter obtained in step S301. Specifically, the worktable is moved by displacements indicated by the displacement adjustment parameters in the first direction and the second direction, and is rotated by an angle indicated by the rotation angle adjustment parameter in the rotation direction. Further, the heights of supporting seats of the worktable are adjusted based on the gap adjustment parameter, so as to adjust the gap between the base table and the worktable.

Figure 4:
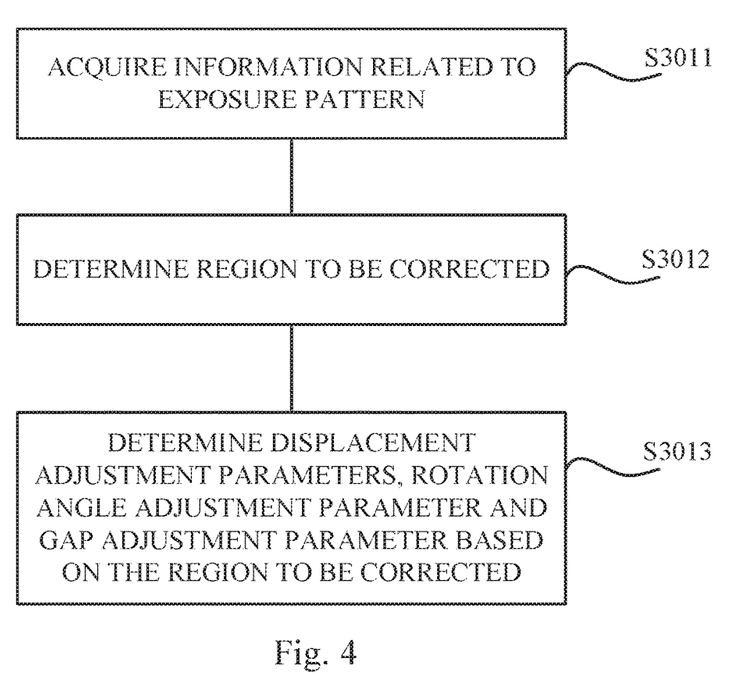
FIG. 4 is a schematic flowchart illustrating the process of obtaining the displacement adjustment parameters, rotation angle adjustment parameter and gap adjustment parameter in an embodiment of the method as shown in FIG. 3.

FIG. 4 is a schematic flowchart illustrating the process of step S301. Firstly at step S3011, the information related to the exposure pattern is acquired. The information related to the exposure pattern may be, for example, a standard exposure pattern, and a formed exposure pattern. Then, at step S3012, a region to be corrected may be determined in the exposure pattern based on the information related to the exposure pattern. In an embodiment, it is performed to compare the standard exposure pattern with the formed exposure pattern, and the mismatched region may be determined as the region to be corrected.

After that, at step S3013, the displacement adjustment parameters, the rotation angle adjustment parameter and the gap adjustment parameter are determined based on the region to be corrected.

In the step S3013, the difference value between the measured value of the position of the liquid crystal cell corresponding to the region to be corrected and a predefined value is be computed, and, based on the difference value, the displacement adjustment parameters, the rotation angle adjustment parameter, and the gap adjustment parameter may be determined. In this step, the predefined value represents the desired position of the liquid crystal cell. The actual position of the liquid crystal cell, which corresponds to the region to be corrected, may be measured based on the exposure pattern, to obtain the measured value. Base on the difference value between the predefined value and the measured value, the displacement adjustment parameters, the rotation angle adjustment parameter, and the gap adjustment parameter can be determined.

The method for correcting exposure patterns on a substrate described herein can adjust the position relationship between the base table and the worktable in 3D space, i.e. adjust the position relationship between the mask plate and the substrate, so that the exposure pattern on the substrate can be corrected. Compared with the existing correction method, the method described herein can improve the correction accuracy, and thus improve the display quality of the display panel.

Figure 5:
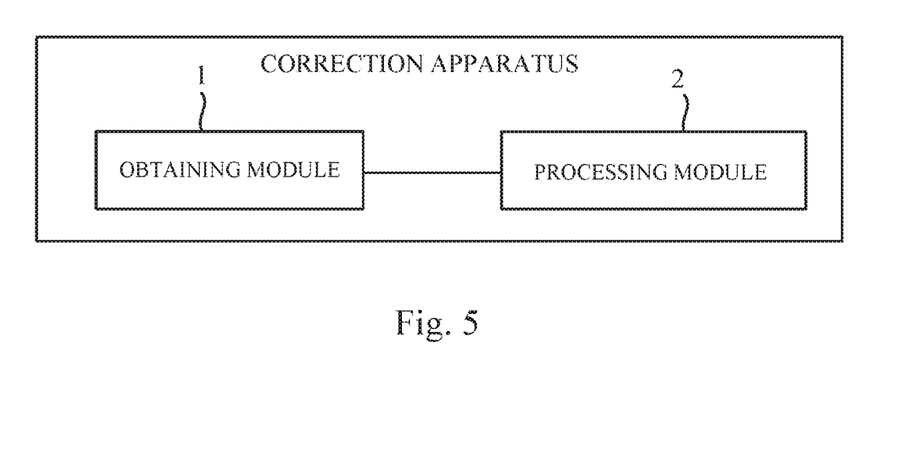
FIG. 5 is a schematic block diagram illustrating the apparatus for correcting an exposure pattern on a substrate according to an embodiment.

FIG. 5 illustrates a schematic block diagram of the apparatus for correcting exposure patterns on a substrate according to an embodiment. As shown in FIG. 5, the apparatus of the embodiment includes an obtaining module 1 and a processing module 2. The obtaining module 1 may obtain the displacement adjustment parameters for adjusting the displacements of the worktable in the first direction and the second direction, the rotation angle adjustment parameter for adjusting the rotation angle of the worktable in the rotation direction and the gap adjustment parameter for adjusting the gap between the worktable and the mask plate, based on the exposure pattern on the substrate. As described above, the first direction and the second direction are perpendicular to each other in the horizontal plane, and the rotation direction is the direction in which the worktable rotates around the central axis of the base table. The processing module 2 may move the worktable based on the displacement adjustment parameters, the rotation angle adjustment parameter and the gap adjustment parameter obtained by the obtaining module 1. In an embodiment, the processing module 2 may move the worktable by the displacements indicated by the displacement adjustment parameters in the first direction and the second direction, rotate the worktable by the angle indicated by the rotation angle adjustment parameter in the rotation direction, and adjust the heights of the supporting seats of the worktable based on the gap adjustment parameter, so as to adjust the gap between the base table and the worktable.

Figure 6:
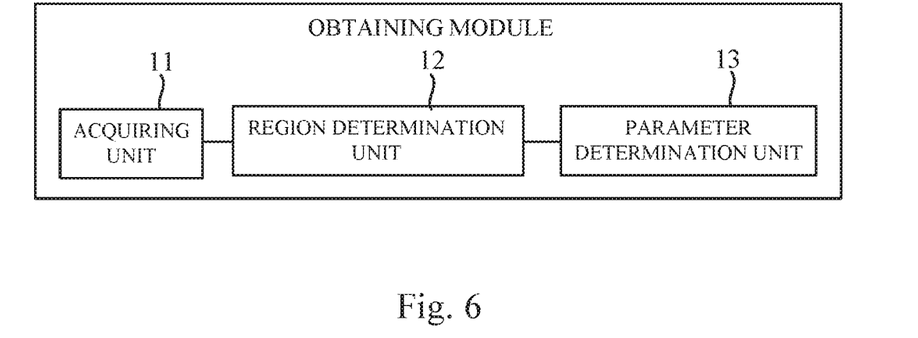
FIG. 6 is a schematic block diagram of an embodiment of the obtaining module as shown in FIG. 5.

FIG. 6 illustrates a schematic block diagram of an embodiment of the obtaining module 1 in the apparatus as shown in FIG. 5. As shown in FIG. 6, in the obtaining module 1, an acquiring unit 11 may acquire the information related to the exposure pattern, for example, the standard exposure pattern and the formed exposure pattern on the substrate. A region determination unit 12 may determine the region to be corrected in the exposure pattern based on the information acquired by the acquiring unit 11. For example, the region determination unit 12 may compare the standard exposure pattern with the formed exposure pattern and determine the mismatched region as the region to be corrected. Then, a parameter determination unit 13 may determine the displacement adjustment parameters, the rotation angle adjustment parameter, and the gap adjustment parameter based on the region to be corrected.

Specifically, in the parameter determination unit 13, a computation subunit may compute the difference value between the measured value of the position of the liquid crystal cell corresponding to the region to be corrected and the predefined value. Then a determination subunit may determine the displacement adjustment parameters, the rotation angle adjustment parameter and the gap adjustment parameter based on the difference value.

The apparatus for correcting an exposure pattern on a substrate described herein can adjust the position relationship between the base table and the worktable in 3D space, i.e. adjust the position relationship between the mask plate and the substrate, to correct the exposure pattern on the substrate. Compared with the existing correction apparatus, the apparatus described herein can improve the correction accuracy, and thus improve the display quality of the display panel.

Figure 7:
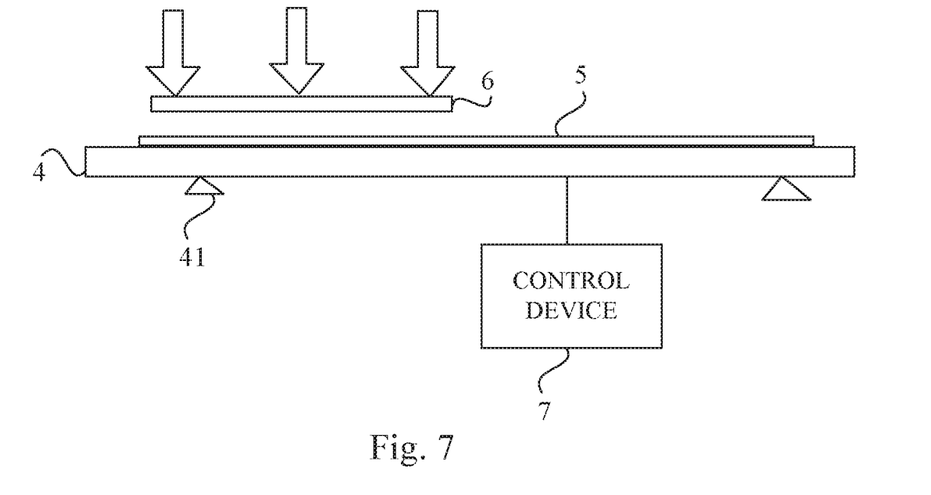
FIG. 7 is a structural schematic diagram illustrating the exposure system according to an embodiment.

FIG. 7 illustrates a structural schematic diagram of the exposure system according to an embodiment. As shown in FIG. 7, the exposure system may include worktable 4 configured to support a substrate 5, a base table located above the worktable 4 and configured to support a mask plate 6, and a control device 7. In addition, the worktable 4 may be provided with a plurality of supporting seats 41, which are coupled to a surface of the worktable 4 which is opposite to the surface supporting the substrate 5.

In an embodiment, the control device 7 may obtain the displacement adjustment parameters for adjusting the displacements of the worktable 4 in the first direction and the second direction, the rotation angle adjustment parameter for adjusting the rotation angle of the worktable 4 in the rotation direction and the gap adjustment parameter for adjusting the gap between the worktable 4 and the mask plate 6, based on the exposure pattern. As discussed above, the first direction and the second direction are perpendicular to each other in the horizontal plane, and the rotation direction is a direction in which the worktable 4 rotates around the central axis of the base table. In addition, the control device 7 may move the worktable 4 based on the obtained displacement adjustment parameters, the rotation angle adjustment parameter and the gap adjustment parameter.

Figure 8:
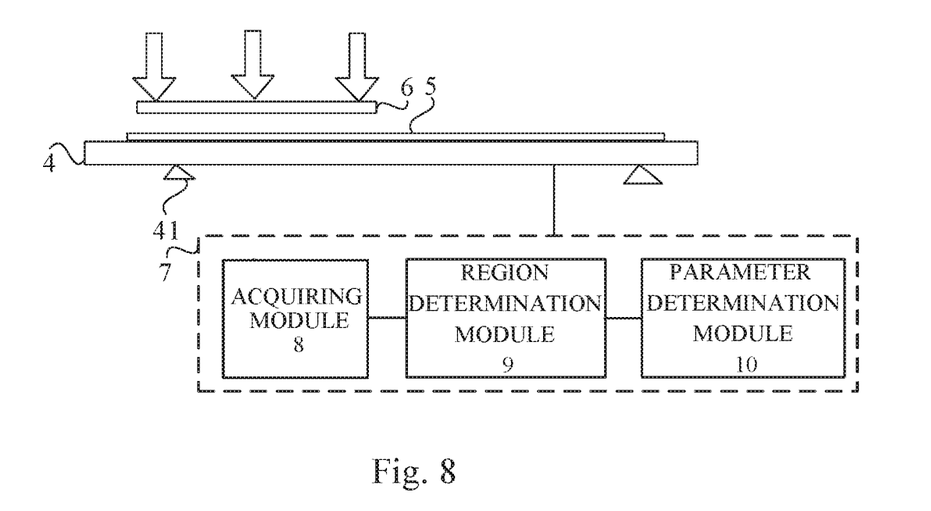
FIG. 8 is a diagram illustrating an example of the exposure system as shown in FIG. 7.

FIG. 8 shows a diagram illustrating an example of the exposure system as shown in FIG. 7. As shown in FIG. 8, the control device 7 may include an acquiring module 8, a region determination module 9 and a parameter determination module 10. The acquiring module 8 may acquire the information related to the exposure pattern on the substrate 5. The region determination module may determine the region to be corrected in the exposure pattern based on the acquired information from the acquiring module 8. Then the parameter determination module 10 may determine the displacement adjustment parameters, the rotation angle adjustment parameter and the gap adjustment parameter based on the region to be corrected.

It should be noted that the obtaining module, the processing module and the control device described herein may be implemented by hardware such as a circuit or software or combination thereof. For example, the processing module may be implemented as a processor, a processing chip or a computer program.

Although the several embodiments of the present disclosure have been described in detail, it is intended to illustrate the present disclosure, but not limit the scope of the present disclosure. Those skilled in the art will appreciate that any modification or variation may be made to the embodiments described herein, without departing from the principle and spirit of the present disclosure. The embodiments described herein and variations thereof should also be considered to fall within the scope of the present disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for correcting a formed exposure pattern on a substrate comprising:
   obtaining, based on the formed exposure pattern, displacement adjustment parameters for adjusting displacements of a worktable supporting the substrate in each of a first direction and a second direction, a rotation angle adjustment parameter for adjusting a rotation angle of the worktable in a rotation direction, and a gap adjustment parameter for adjusting a gap between the worktable and a mask plate, wherein the first direction and the second direction are perpendicular to each other in a horizontal plane, and wherein the rotation direction is a direction in which the worktable rotates around a central axis of a base table supporting the mask plate; and
   moving the worktable based on the displacement adjustment parameters, the rotation angle adjustment parameter and the gap adjustment parameter.

2. The method according to claim 1, wherein obtaining the displacement adjustment parameters, the rotation angle adjustment parameter and the gap adjustment parameter based on the formed exposure pattern comprises:
   acquiring the formed exposure pattern and a corresponding standard exposure pattern;
   determining a region to be corrected in the formed exposure pattern based on the formed exposure pattern and the corresponding standard exposure pattern; and
   determining the displacement adjustment parameters, the rotation angle adjustment parameter and the gap adjustment parameter based on the region to be corrected.

3. The method according to claim 2, wherein determining the displacement adjustment parameters, the rotation angle adjustment parameter and the gap adjustment parameter based on the region to be corrected comprises:
   computing a difference value between a measured value of a position of a liquid crystal cell corresponding to the region to be corrected and a predefined value; and
   determining the displacement adjustment parameters, the rotation angle adjustment parameter and the gap adjustment parameter based on the difference value.

4. The method according to claim 1, wherein moving the worktable based on the gap adjustment parameter comprises:
   adjusting a height of at least one supporting seat of the worktable based on the gap adjustment parameter.

5. An apparatus for correcting a formed exposure pattern on a substrate comprising:
   an obtaining module configured to obtain, based on the formed exposure pattern, displacement adjustment parameters for adjusting displacements of a worktable supporting the substrate in each of a first direction and a second direction, a rotation angle adjustment parameter for adjusting a rotation angle of the worktable in a rotation direction and a gap adjustment parameter for adjusting a gap between the worktable and a mask plate, wherein the first direction and the second direction are perpendicular to each other in a horizontal plane, and wherein the rotation direction is a direction in which the worktable rotates around a central axis of a base table supporting the mask plate; and
   a processing module configured to move the worktable based on the displacement adjustment parameters, the rotation angle adjustment parameter and the gap adjustment parameter.

6. The apparatus according to claim 5, wherein the obtaining module comprises:
   an acquiring unit configured to acquire the formed exposure pattern and a corresponding standard exposure pattern;
   a region determination unit configured to determine a region of the formed exposure pattern to be corrected based on the formed exposure pattern and the corresponding standard exposure pattern; and
   a parameter determination unit configured to determine the displacement adjustment parameters, the rotation angle adjustment parameter and the gap adjustment parameter based on the region to be corrected.

7. The apparatus according to claim 6, wherein the parameter determination unit comprises:
   a computation subunit configured to compute a difference value between a measured value of a position of a liquid crystal cell corresponding to the region to be corrected and a predefined value; and
   a determination subunit configured to determine the displacement adjustment parameters, the rotation angle adjustment parameter and the gap adjustment parameter based on the difference value.

8. The apparatus according to claim 5, wherein the processing module is further configured to adjust a height of at least one supporting seat of the worktable based on the gap adjustment parameter.

9. An exposure system comprising:
   a worktable comprising a first surface configured to support a substrate, wherein the worktable is provided with supporting seats coupled to a second surface of the worktable opposite the first surface;
   a base table located above the worktable and configured to support a mask plate; and
   a control device configured to obtain, based on a formed exposure pattern on the substrate, displacement adjustment parameters for adjusting displacements of the worktable in each of a first direction and a second direction, a rotation angle adjustment parameter for adjusting a rotation angle of the worktable in a rotation direction, and a gap adjustment parameter for adjusting a gap between the worktable and the mask plate, wherein the first direction and the second direction are perpendicular to each other in a horizontal plane, and wherein the rotation direction is a direction in which the worktable rotates around a central axis of the base table, wherein the control device is further configured to move the worktable based on the displacement adjustment parameters, the rotation angle adjustment parameter and the gap adjustment parameter.

10. The exposure system according to claim 9, wherein the control device comprises:
    an acquiring module configured to acquire the formed exposure pattern and a corresponding standard exposure pattern;

a region determination module configured to determine a region of the formed exposure pattern to be corrected based on the formed exposure pattern and the corresponding standard exposure pattern; and a parameter determination module configured to determine the displacement adjustment parameters, the rotation angle adjustment parameter and the gap adjustment parameter based on the region to be corrected.

* * * * *